US012724075B2

(12) United States Patent
Nishimoto et al.

(10) Patent No.: US 12,724,075 B2
(45) Date of Patent: Sep. 1, 2026

(54) BATTERY CHARACTERISTIC ESTIMATION DEVICE, BATTERY CHARACTERISTIC ESTIMATION METHOD AND STORAGE MEDIUM

(71) Applicant: HONDA MOTOR CO., LTD., Tokyo (JP)

(72) Inventors: Yurika Nishimoto, Wako (JP); Kaoru Omichi, Wako (JP); Yuki Tominaga, Wako (JP); Hikaru Arai, Yokohama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 467 days.

(21) Appl. No.: 18/112,524

(22) Filed: Feb. 22, 2023

(65) Prior Publication Data

US 2023/0288483 A1 Sep. 14, 2023

(30) Foreign Application Priority Data

Mar. 14, 2022 (JP) ................................ 2022-039175

(51) Int. Cl.

*G01R 31/36* (2020.01)
*G01R 31/3835* (2019.01)
*G01R 31/389* (2019.01)

(52) U.S. Cl.

CPC ..... *G01R 31/3648* (2013.01); *G01R 31/3835* (2019.01); *G01R 31/389* (2019.01)

(58) Field of Classification Search

CPC ............ G01R 31/3648; G01R 31/3835; G01R 31/389; Y02E 60/10

See application file for complete search history.

(56) References Cited

U.S. PATENT DOCUMENTS

2011/0227587 A1* 9/2011 Nakanishi ............ G01R 31/389 324/649
2013/0103224 A1* 4/2013 Egami ............... H01M 8/04582 700/297

(Continued)

FOREIGN PATENT DOCUMENTS

CN 107615087 1/2018
CN 109212431 1/2019

(Continued)

OTHER PUBLICATIONS

Japanese Office Action for Japanese Patent Application No. 2022-039175 mailed Oct. 31, 2023.

(Continued)

*Primary Examiner* — Ricky Go
(74) *Attorney, Agent, or Firm* — Amin, Turocy & Watson, LLP

(57) ABSTRACT

A battery characteristic estimation device includes a first calculation part configured to calculate a first electrical characteristic value of a secondary battery on the basis of frequency-dependent data that is data of an output voltage of the secondary battery changed by a frequency of alternating current applied to the secondary battery, a second calculation part configured to calculate a second electrical characteristic value of the secondary battery on the basis of transient response data that is data of the output voltage of the secondary battery attenuated by a change in direct current applied to the secondary battery, and an estimation part configured to estimate an electrical characteristic value of the secondary battery on the basis of the first electrical characteristic value and the second electrical characteristic value.

3 Claims, 5 Drawing Sheets

(56) References Cited

U.S. PATENT DOCUMENTS

| | | | | |
|---|---|---|---|---|
| 2016/0131719 | A1* | 5/2016 | Takahashi | G01R 31/389<br>324/430 |
| 2016/0372935 | A1 | 12/2016 | Sakata et al. | |
| 2019/0064278 | A1* | 2/2019 | Oguma | G01R 31/374 |
| 2019/0271747 | A1* | 9/2019 | Osaka | G01R 31/367 |
| 2022/0128629 | A1* | 4/2022 | Tominaga | G01R 31/386 |
| 2022/0317191 | A1 | 10/2022 | Munakata et al. | |

FOREIGN PATENT DOCUMENTS

| | | |
|---|---|---|
| CN | 113631936 | 11/2021 |
| JP | 2004-251625 | 9/2004 |
| JP | 2008-298786 | 12/2008 |
| JP | 2011-141228 | 7/2011 |
| JP | 2012-220199 | 11/2012 |
| JP | 2015-104139 | 6/2015 |
| JP | 2015-206758 | 11/2015 |
| JP | 6410986 | 10/2018 |
| JP | 2020-041917 | 3/2020 |
| JP | 2021-022455 | 2/2021 |
| WO | 2017/158706 | 9/2017 |

OTHER PUBLICATIONS

Chinese Office Action for Chinese Patent Application No. 202310097474.1 mailed on Jun. 10, 2026.

Cai Chenghui et al., “High frequency transient model of traction battery during charging”, Department of Mechanical Engineering, Tsinghua University, Beijing 100084, China.

Li Yan et al., “Accurate estimation of lithium battery SOC based on improved UKF algorithm”, College of Mechanical and Electrical Engineering Central South University of Forestry and Technology, Changsha 410004, China.

* cited by examiner

FIG. 4

V
$R_0$
time

FIG. 5

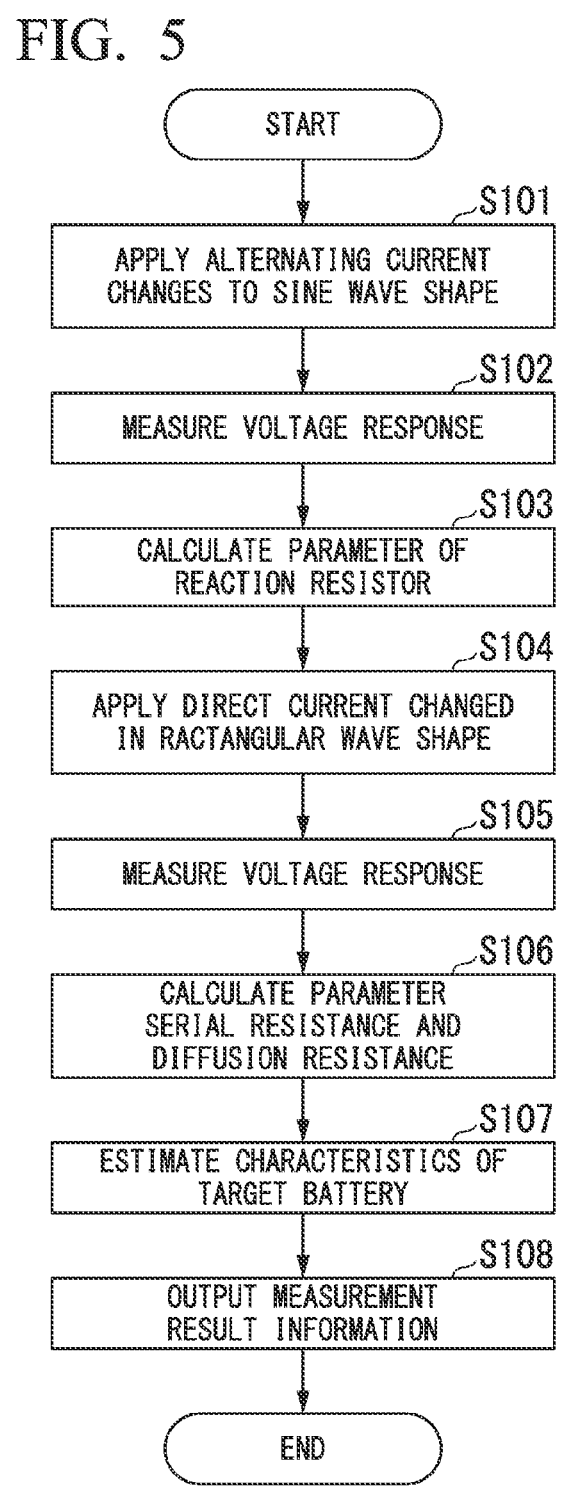

START

S101 APPLY ALTERNATING CURRENT CHANGES TO SINE WAVE SHAPE

S102 MEASURE VOLTAGE RESPONSE

S103 CALCULATE PARAMETER OF REACTION RESISTOR

S104 APPLY DIRECT CURRENT CHANGED IN RACTANGULAR WAVE SHAPE

S105 MEASURE VOLTAGE RESPONSE

S106 CALCULATE PARAMETER SERIAL RESISTANCE AND DIFFUSION RESISTANCE

S107 ESTIMATE CHARACTERISTICS OF TARGET BATTERY

S108 OUTPUT MEASUREMENT RESULT INFORMATION

END

FIG. 6

3.8
3.7
3.6
3.5
3.4
3.3
3.2
OUTPUT VOLTAGE[V]
0
2
4
6
8
10
12
ELAPSED TIME[SECONDS]
ACTUAL MEASUREMENT
SECOND
FIRST

BATTERY CHARACTERISTIC ESTIMATION DEVICE, BATTERY CHARACTERISTIC ESTIMATION METHOD AND STORAGE MEDIUM

CROSS-REFERENCE TO RELATED APPLICATION

Priority is claimed on Japanese Patent Application No. 2022-039175, filed Mar. 14, 2022, the content of which is incorporated herein by reference.

BACKGROUND OF THE INVENTION

Field of the Invention

The present invention relates to a battery characteristic estimation device, a battery characteristic estimation method and a storage medium.

Description of Related Art

When a resistance value of an impedance of a battery is low, data noise may increase due to a measurement limit of a measuring instrument. For this reason, when the resistance value is estimated based on data of the impedance, an error between an estimation result and an actual measurement result may increase, and there is a possibility that the resistance value may not be estimated accurately (Japanese Unexamined Patent Application, First Publication No. 2021-22455, Japanese Unexamined Patent Application, First Publication No. 2011-141228, PCT International Patent Publication No. 2017/158706).

SUMMARY OF THE INVENTION

One purpose of an aspect of the present invention is directed to estimating impedance of a battery accurately. Further, one purpose is to improve energy efficiency by estimating impedance of the battery accurately.

A battery characteristic estimation device, a battery characteristic estimation method and a storage medium according to the present invention employ the following configuration.

(1) A battery characteristic estimation device according to an aspect of the present invention is a battery characteristic estimation device including: a first calculation part configured to calculate a first electrical characteristic value of a secondary battery on the basis of frequency-dependent data that is data of an output voltage of the secondary battery changed by a frequency of alternating current applied to the secondary battery; a second calculation part configured to calculate a second electrical characteristic value of the secondary battery on the basis of transient response data that is data of the output voltage of the secondary battery attenuated by a change in direct current applied to the secondary battery; and an estimation part configured to estimate an electrical characteristic value of the secondary battery on the basis of the first electrical characteristic value and the second electrical characteristic value.

(2) In the aspect of the above-mentioned (1), the first electrical characteristic value is an impedance of a reaction resistor, and the second electrical characteristic value is an impedance of a serial resistance and a diffusion resistance.

(3) A battery characteristic estimation method according to an aspect of the present invention is a battery characteristic estimation method of causing a computer to: calculate a first electrical characteristic value of a secondary battery on the basis of frequency-dependent data that is data of an output voltage of the secondary battery changed by a frequency of alternating current applied to the secondary battery; calculate a second electrical characteristic value of the secondary battery on the basis of transient response data that is data of the output voltage of the secondary battery attenuated by a change in direct current applied to the secondary battery; and estimate an electrical characteristic value of the secondary battery on the basis of the first electrical characteristic value and the second electrical characteristic value.

(4) A storage medium according to an aspect of the present invention is a computer-readable non-transient storage medium on which a program is stored to cause a computer to: calculate a first electrical characteristic value of a secondary battery on the basis of frequency-dependent data that is data of an output voltage of the secondary battery changed by a frequency of alternating current applied to the secondary battery; calculate a second electrical characteristic value of the secondary battery on the basis of transient response data that is data of the output voltage of the secondary battery attenuated by a change in direct current applied to the secondary battery; and estimate an electrical characteristic value of the secondary battery on the basis of the first electrical characteristic value and the second electrical characteristic value.

According to the aspects of the above-mentioned (1) to (4), it is possible to estimate an impedance of the battery accurately by estimating an electrical characteristic value of the secondary battery on the basis of frequency-dependent data and transient response data.

BRIEF DESCRIPTION OF THE DRAWINGS

FIG. 4 is an example of a graph showing a transient response.

FIG. 5 is a flowchart showing an example of processing of causing a battery characteristic estimation device to estimate battery characteristics of the target battery.

FIG. 6 is a graph showing an examination result.

DETAILED DESCRIPTION OF THE INVENTION

Hereinafter, embodiments of a battery characteristic estimation device, a battery characteristic estimation method and a storage medium of the present invention will be described with reference to the accompanying drawings.

[Configuration of Battery Characteristic Estimation Device]

Figure 1:
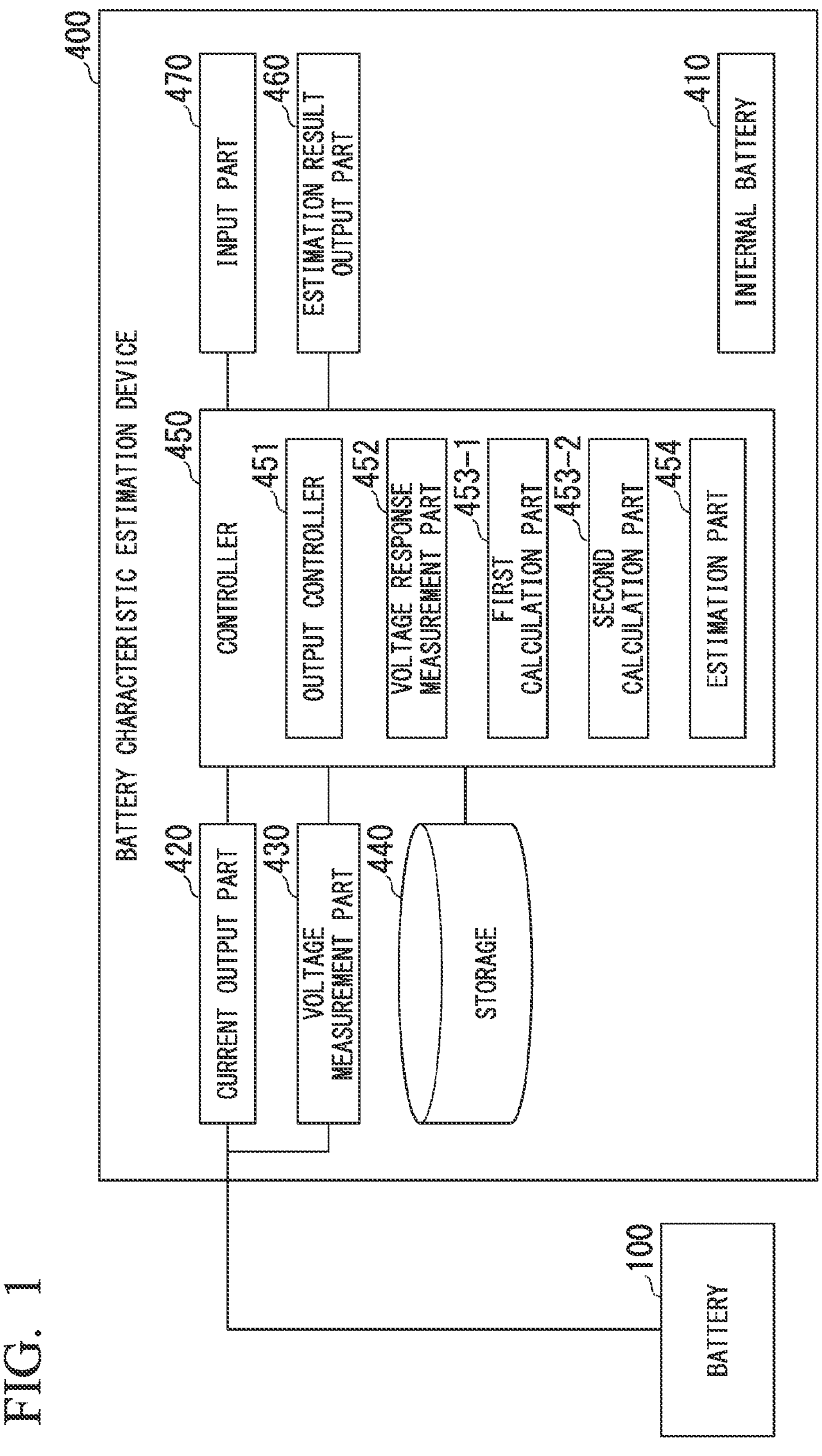
FIG. 1 is a view showing a configuration example of a battery characteristic estimation device according to an embodiment.

FIG. 1 is a view showing a configuration example of a battery characteristic estimation device 400 according to the embodiment. The battery characteristic estimation device 400 is connected to a battery 100, and estimates characteristics of the battery 100. The battery characteristic estimation device 400 includes an internal battery 410, a current output part 420, a voltage measurement part 430, a storage 440, a controller 450, an estimation result output part 460, and an input part 470. The controller 450 is realized by executing a program (software) using a hardware processor such as a central processing unit (CPU) or the like. Some or all of these components may be realized by hardware (a circuit part; including circuitry) such as large scale integration (LSI), an application specific integrated circuit (ASIC), a field-programmable gate array (FPGA), a graphics processing unit (GPU), or the like, or may be realized by software and hardware in cooperation. The program may be stored in a storage device (a storage device including a non-transient storage medium) such as a hard disk drive (HDD), a flash memory, or the like, in advance, may be stored in a detachable storage medium (non-transient storage medium) such as a DVD, a CD-ROM, or the like, or may be installed by mounting the storage medium in a drive device.

The internal battery 410 is a battery configured to supply electric power required for an operation of the battery characteristic estimation device 400. Each functional unit of the battery characteristic estimation device 400 can be operated by the electric power supplied by the internal battery 410. The internal battery 410 may be a battery or may be an interface configured to acquire electric power from another power supply. Hereinafter, in order to be distinguished from the internal battery 410 configured to supply electric power required for an operation of the battery characteristic estimation device 400, the battery 100 of which battery characteristics are to be estimated may be referred to as "a target battery."

The current output part 420 is a current application circuit controlled to apply a specified current to the target battery 100. The current output part 420 applies the current with intensity indicated by the controller 450 to the target battery 100. The current output from the current output part 420 is applied to the battery 100 via a probe P.

The voltage measurement part 430 is a voltage measurement circuit configured to measure an output voltage of the target battery 100. The voltage measurement part 430 outputs the measurement value of the output voltage of the target battery 100 to the controller 450. The timing of the voltage measurement part 430 measuring the output voltage of the target battery 100 is controlled by the controller 450.

The storage 440 is configured using a magnetic storage device such as a hard disk drive (HDD) or the like, or a semiconductor storage device such as a solid state drive (SSD) or the like. The storage 440 stores various types of information related to an operation of the battery characteristic estimation device 400. For example, the storage 440 stores measurement data of the output voltage of the target battery 100, information showing an estimation result of battery characteristics, setting information of a current applied to the target battery 100, various types of program data that realizes the controller 450, or the like.

The controller 450 controls each functional unit of the battery characteristic estimation device 400 to enable the battery characteristic estimation device 400 to estimate battery characteristics of the target battery 100. Specifically, the controller 450 includes an output controller 451, a voltage response measurement part 452, a first calculation part 453-1, a second calculation part 453-2, and an estimation part 454.

The output controller 451 has a function of applying a specified current for the purpose of estimation of battery characteristics (hereinafter referred to as "current for estimation") to the target battery 100 by controlling the output intensity of the current output part 420. For example, the output controller 451 can apply an alternating current changed in a sine wave shape with respect to the target battery 100 by continuously changing the output intensity of the current output part 420. In addition, the output controller 451 can apply a direct current changed in a rectangular wave shape with respect to the target battery 100 by changing the output intensity of the current output part 420 at predetermined timing.

Further, output controller 451 may be configured to start application of the current for estimation to the target battery 100 by detecting connection of the target battery 100 to the battery characteristic estimation device 400. In addition, when the battery characteristic estimation device 400 includes an input device such as a mouse, a keyboard, or the like, the output controller 451 may be configured to start application of the current for estimation to the target battery 100 according to the input operation of the user.

The voltage response measurement part 452 has a function of measuring an output voltage of the target battery 100 upon application of the current for estimation. That is, the voltage response measurement part 452 has a function of measuring a response of the output voltage of the target battery 100 with respect to application of the current for estimation. When the alternating current changed in the sine wave shape is applied to the target battery 100, the voltage response measurement part 452 measures the output voltage changed according to the frequency of the alternating current. When the direct current changed in the rectangular wave shape is applied to the target battery 100, the voltage response measurement part 452 measures the output voltage that is attenuated as time elapses. The voltage response measurement part 452 acquires measurement data after the timing when application of the current for estimation to the target battery 100 is started among the measurement value of the output voltage of the target battery 100 output from the voltage measurement part 430, and outputs the acquired measurement data to the first calculation part 453-1 and the second calculation part 453-2. The measurement data includes data of the output voltage changed according to the frequency of the alternating current (hereinafter, frequency-dependent data), and data of the output voltage that is attenuated as time elapses (hereinafter, transient response data).

The first calculation part 453-1 calculates a first electrical characteristic value that is a value showing electrical characteristics of the target battery 100 on the basis of the frequency-dependent data. The second calculation part 453-2 calculates a second electrical characteristic value that is a value showing electrical characteristics of the target battery 100 on the basis of the transient response data. The first electrical characteristic value and the second electrical characteristic value may not include the same electrical characteristic value. For example, the first electrical characteristic value is a reaction resistor of the target battery 100, and the second electrical characteristic value is a serial resistance and a diffusion resistance. The reaction resistor, the serial resistance and the diffusion resistance will be described below.

Figure 2:
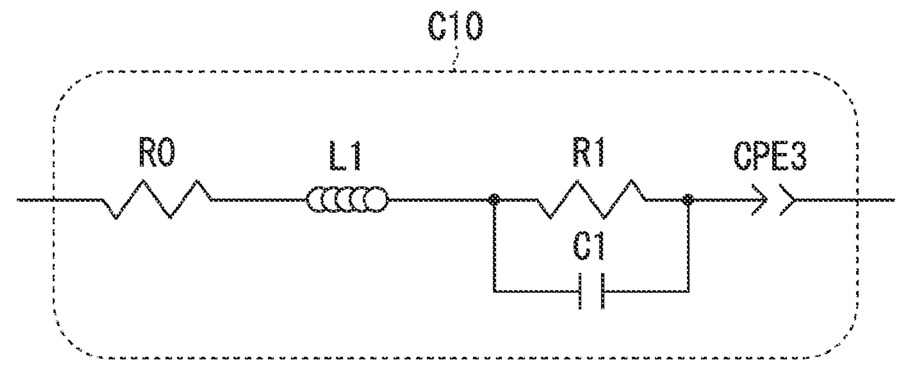
FIG. 2 is an example showing an equivalent circuit of a target battery.

FIG. 2 is an example showing an equivalent circuit of the target battery 100. A circuit C10 is a circuit in which a resistor R0 that is a serial circuit, a circuit constituted by a coil L1 and a resistor R1 that are reaction resistors and a capacitor C1, and a constant phase element (CPE) 3 that is a diffusion resistance, are connected in series. In the equivalent circuit, impedances of the resistor R0 and the resistor R1 are $R_0$ and $R_1$, respectively. The impedance of the coil L1 is $j\omega L_1$. The impedance of the capacitor C1 is $(j\omega C_1)^{-1}$. The impedance of the CPE 3 is $((j\omega)^p T)^{-1}$. Here, ω is an angular frequency of the applied alternating current, $L_1$ is an inductance of the coil L1, $C_1$ is a capacitance of the capacitor C1, and T and p are characteristic values determined depending on the CPE 3.

Figure 3:
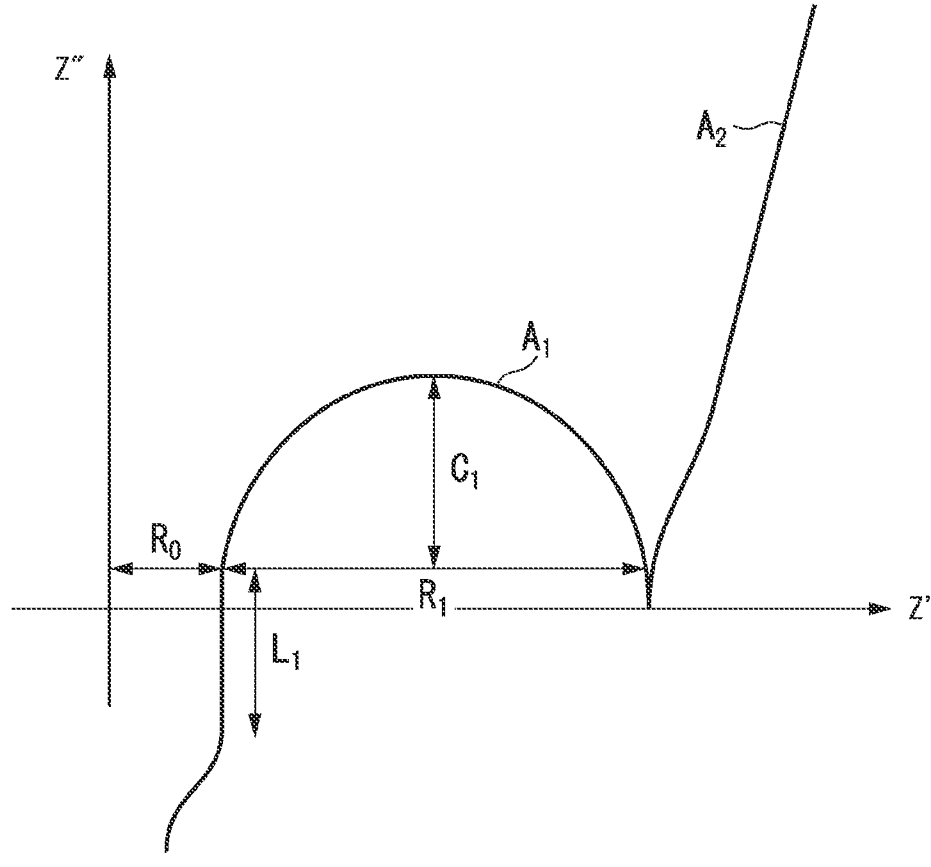
FIG. 3 is an example of a Cole-Cole plot.

FIG. 3 is an example of a Cole-Cole plot. In the Cole-Cole plot, an oval $A_1$ is observed. A length of the oval $A_1$ in the longitudinal direction is $C_1$, and a length in the lateral direction is $R_1$. In addition, $L_1$ is expressed as a line segment in the longitudinal direction at a left endpoint of the oval $A_1$, and a length of the line segment is $L_1$. In addition, $R_0$ is a lateral ingredient of the left endpoint of the oval $A_1$. In addition, p is a value obtained by dividing an inclination angle of a straight line $A_2$ extending from a right endpoint of the oval $A_1$ by 90 degrees that is a right angle. T can be calculated from a ratio of the change of the straight line $A_2$.

The first calculation part 453-1 calculates the impedance depending on the frequency of the current based on the frequency-dependent data and the current for estimation, and creates the Cole-Cole plot. After that, the first calculation part 453-1 calculates a parameter of the equivalent circuit to be fitted to the created Cole-Cole plot. Accordingly, the first calculation part 453-1 can calculate $C_1$, $R_1$ and $L_1$ that are parameters of the reaction resistors as the first electrical characteristic values.

Figure 4:
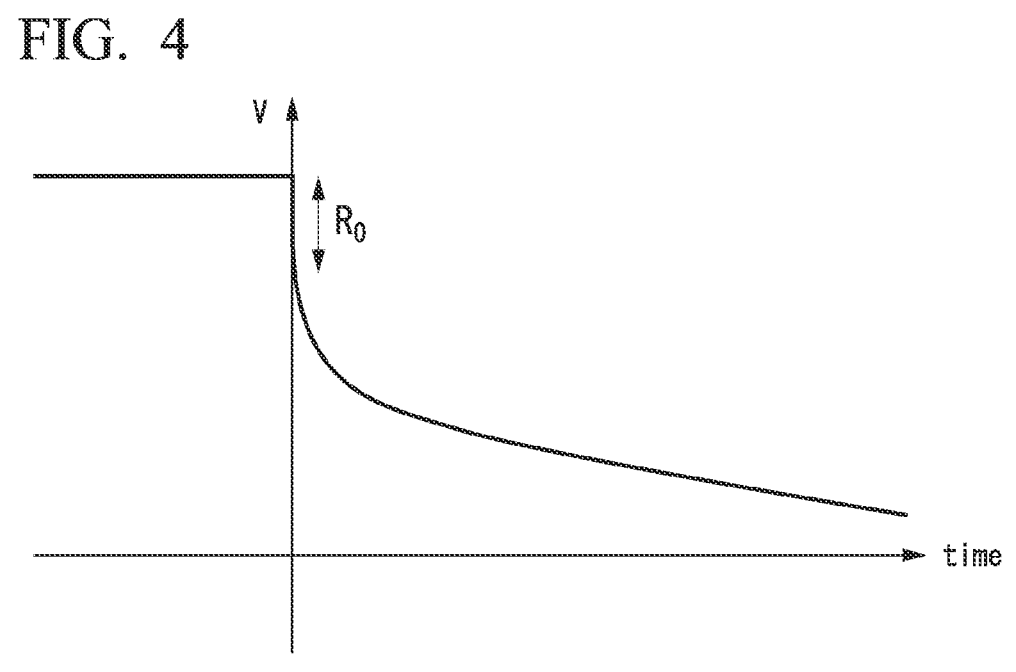

FIG. 4 is an example of a graph showing a transient response. When the current of 1 A applied to the target battery 100 is switched not to be applied, the voltage output from the target battery 100 is immediately decreased and then attenuated. When an elapsed time from the time when the current is switched not to be applied is set as t, magnitudes of the output voltages in the resistor R0, the resistor R1 and the CPE are expressed as 0, Equation (1) and Equation (2), respectively.

$$R_1\left(1 - e^{-\frac{t}{R_1 C_1}}\right) \tag{1}$$

$$\frac{1}{T} t^{\frac{p}{\Gamma(p)}} \tag{2}$$

Here, Γ(p) is a gamma function of p. The second calculation part 453-2 calculates a parameter of the equivalent circuit such that a sum of squared differences of (i) the voltage indicating the transient response data at a plurality of time points and (ii) the voltage showing the simulation result of the transient response based on the parameter of the equivalent circuit at the same time points is minimized. Accordingly, the second calculation part 453-2 can calculate $R_0$, T and p that are parameters of the serial resistance and the diffusion resistance as the second electrical characteristic values.

The estimation part 454 estimates an electrical characteristic value of the target battery 100 on the basis of the first electrical characteristic value and the second electrical characteristic value. Specifically, the estimation part 454 estimates the parameter of the reaction resistor that is the first electrical characteristic value as the parameter of the reaction resistor of the target battery 100. In addition, the estimation part 454 estimates the parameters of the serial resistance and the diffusion resistance that are the second electrical characteristic values as the parameters of the serial resistance and the diffusion resistance of the target battery 100. The estimation part 454 outputs the information showing the estimation result of the battery characteristics performed with respect to the target battery 100 (hereinafter, referred to as "estimation result information") to the estimation result output part 460.

The estimation result output part 460 outputs the estimation result information output from the estimation part 454 as the predetermined aspect. For example, the estimation result output part 460 includes a display device such as a liquid crystal display, an organic electro-luminescence (EL) display, or the like, and the estimation result information may be displayed on these display devices. In addition, for example, the estimation result output part 460 includes a wired or wireless communication interface, and the estimation result information may be transmitted to another communication device via these communication interfaces. In addition, the estimation result output part 460 includes a sound output device such as a speaker or the like, and sound indicating contents of the estimation result information may be output by the sound output device.

The input part 470 has a function of inputting information related to an operation of the battery characteristic estimation device 400. For example, the input part 470 includes an input device such as a mouse, a keyboard, or the like, and may be configured to input necessary information via these input devices. In addition, the input part 470 includes a wired or wireless communication interface, and may be configured to input necessary information via these communication interfaces. The input part 470 outputs the input information to the controller 450.

FIG. 5 is a flowchart showing an example of processing of estimating battery characteristics of the target battery 100 using the battery characteristic estimation device 400. Here, at the beginning of the flowchart, the battery characteristic estimation device 400 is connected to the target battery 100 of the estimation target. First, in the battery characteristic estimation device 400, the output controller 451 controls the current output part 420 and applies an alternating current changed in a sine wave shape as the current for estimation to the target battery 100 (step S101).

Next, the voltage response measurement part 452 measures the output voltage of the target battery 100 upon application of the alternating current (step S102). Specifically, the voltage response measurement part 452 acquires the measurement data after the timing when application of the current for estimation to the target battery 100 is started, among the measurement value of the output voltage of the target battery 100 output from the voltage measurement part 430. The voltage response measurement part 452 outputs the acquired measurement data to the first calculation part 453-1.

Next, the first calculation part 453-1 calculates a first electrical characteristic value of the target battery 100 by calculation using the measurement data of the voltage response of the target battery 100 output from the voltage response measurement part 452. Specifically, the first calculation part 453-1 calculates a value of the impedance of the reaction resistor of the target battery 100 as first electrical characteristic value (step S103).

Next, the output controller 451 controls the current output part 420, and applies the direct current changed in a rectangular wave shape as the current for estimation to the target battery 100 (step S104).

Next, the voltage response measurement part 452 measures the output voltage of the target battery 100 upon application of the alternating current (step S105). The voltage response measurement part 452 outputs the acquired measurement data to the second calculation part 453-2.

Next, the second calculation part 453-2 acquires a second electrical characteristic value of the target battery 100 by calculation using measurement data of the voltage response of the target battery 100 output from the voltage response measurement part 452. Specifically, the second calculation part 453-2 calculates a value of the impedance of the serial resistance and the diffusion resistance of the target battery 100 as the second electrical characteristic value (step S106).

Next, the estimation part 454 estimates characteristics of the target battery 100 on the basis of the first electrical characteristic value and the second electrical characteristic value (step S107). Specifically, the estimation part 454 estimates the impedance of the reaction resistor that is the first electrical characteristic value as the impedance of the reaction resistor of the target battery 100. In addition, the impedance of the serial resistance and the diffusion resistance that is the second electrical characteristic value is estimated as the impedance of the serial resistance and the diffusion resistance of the target battery 100. The estimation part 454 outputs the estimation result information to the estimation result output part 460.

Next, the estimation result output part 460 outputs the estimation result information (step S108).

<Examination Result>

Next, an examination performed using the estimation result information output from the battery characteristic estimation device 400 will be described. In this examination, the parameters of the equivalent circuit of the target battery 100 are two types of a first parameter and a second parameter. The first parameter is a parameter set on the basis of the estimation result information. The second parameter is a parameter set by the calculation result based on only the frequency-dependent data by the first calculation part 453-1. That is, the second parameter is set without using the transient response data. Further, the values of the serial resistance and the diffusion resistance included in the second parameter are set by the calculation result based on the frequency-dependent data. As described above, the first parameter and the second parameter differ in that the parameters of the serial resistance and the diffusion resistance are based on the transient response data or the frequency-dependent data.

Figure 6:
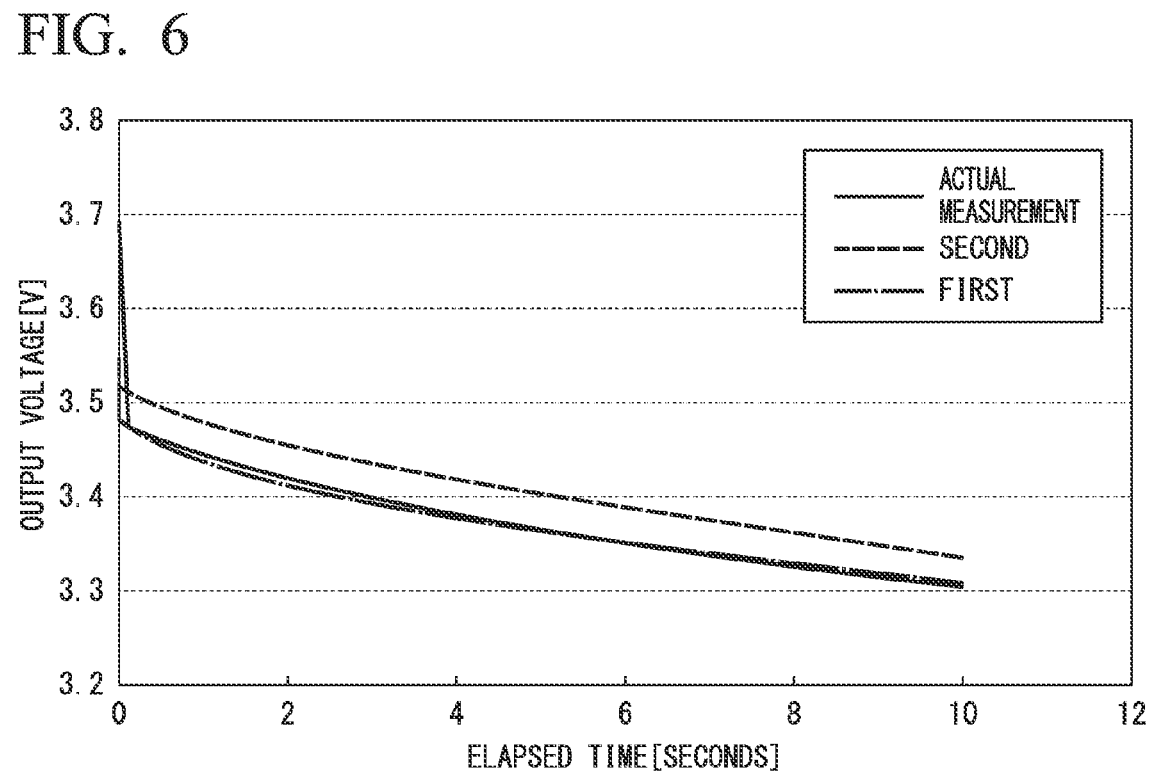

Simulation of the transient response was performed on the basis of the first parameter and the second parameter. In addition, the output voltage on the transient response of the target battery 100 was measured. FIG. 6 is a graph showing an examination result. "Actual measurement" shows an actual measurement result. "Second" is a simulation result using the second parameter. "First" is a simulation result using the first parameter. It can be seen that the simulation result using the first parameter is closer to the actual measurement result than the simulation result using the second parameter.

According to the embodiment as described above, the battery characteristic estimation device 400 includes the first calculation part 453-1 configured to calculate the first electrical characteristic value of the battery 100 on the basis of the frequency-dependent data that is data of the output voltage of the battery 100 changed by the frequency of the alternating current applied to the battery 100, the second calculation part 453-2 configured to calculate the second electrical characteristic value of the battery 100 on the basis of the transient response data that is data of the output voltage of the battery 100 attenuated by the change in direct current applied to the battery 100, and the estimation part configured to estimate the electrical characteristic value of the battery 100 on the basis of the first electrical characteristic value and the second electrical characteristic value, and thus, the electrical characteristic value of the secondary battery can be estimated on the basis of the frequency-dependent data and the transient response data, and impedance of the battery can be estimated accurately.

The above-mentioned embodiment can be expressed as follows.

A battery characteristic estimation device includes:

a storage device on which a program is stored; and a hardware processor, the device is being configured to calculate a first electrical characteristic value of a secondary battery on the basis of frequency-dependent data that is data of an output voltage of the secondary battery changed by a frequency of alternating current applied to the secondary battery, calculate a second electrical characteristic value of the secondary battery on the basis of transient response data that is data of the output voltage of the secondary battery attenuated by a change in direct current applied to the secondary battery, and estimate an electrical characteristic value of the secondary battery on the basis of the first electrical characteristic value and the second electrical characteristic value, by executing the program stored on the storage device using the hardware processor.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A battery characteristic estimation device comprising:

a current output device configured to apply current to a second battery;

voltage measurement device configured to measure output voltage of the second battery; and a controller configured to:

control the current output device to apply alternating current to the second battery;

acquire frequency-dependent data from the voltage measurement device, the frequency-dependent data being data of the voltage changed in accordance with a frequency of the alternating current;

calculate a first electrical characteristic value of a secondary battery based on the frequency-dependent data;

control the current output device to apply a direct current to the secondary battery;

acquire transient response data from the voltage measurement device, the transient response data being data of the output voltage attenuated with time in response to a change in direct current;

calculate a second electrical characteristic value of the second battery based on the transient response data;

estimate an electrical characteristic value of the secondary battery based on the first electrical characteristic value and the second electrical characteristic value, wherein the first electrical characteristic value is an impedance of a reaction resistor, the second electrical characteristic value is an impedance of a serial resistance and a diffusion resistance, and wherein the controller is further configured to:

control charging or discharging of the second battery through the current output device based on the electrical characteristic value so as to reduce energy loss caused by the reaction resistor, the serial resistance, and the diffusion resistance, thereby maximizing an energy efficiency of the second battery.

2. A battery characteristic estimation method comprising:

applying an alternating current to a second battery;

measuring an output voltage of the secondary battery to obtain frequency-dependent data that is data of an output voltage of the secondary battery changed by a frequency of the alternating current applied to the secondary battery calculating a first electrical characteristic value of a secondary battery based on frequency-dependent data;

applying a direct current to the secondary battery;

measuring an output voltage of the secondary battery to obtain transient response data that is data of the output voltage of the secondary battery attenuated by a change in direct current applied to the secondary battery;

calculating a second electrical characteristic value of the secondary battery based on the transient response data; and estimating an electrical characteristic value of the secondary battery based on the first electrical characteristic value and the second electrical characteristic value, wherein the first electrical characteristic value is an impedance of a reaction resistor, the second electrical characteristic value is an impedance of a serial resistance and a diffusion resistance, and controlling charging or discharging of the second battery through the applying of the alternating current to the second battery based on the electrical characteristic value so as to reduce energy loss caused by the reaction resistor, the serial resistance, and the diffusion resistance, thereby maximizing an energy efficiency of the second battery.

3. A non-transitory computer-readable storage medium storing a program that, when executed by a controller of a battery characteristic estimation device including a current output device and a voltage measurement device causes the controller to:

calculate a first electrical characteristic value of a secondary battery based on frequency-dependent data that is data of an output voltage of the secondary battery changed by a frequency of alternating current applied to the secondary battery;

control the current output device to applying a direct current to the secondary battery:

acquire transient response data from the voltage estimation device;

calculate a second electrical characteristic value of the secondary battery based on the transient response data that is data of the output voltage of the secondary battery attenuated by a change in direct current applied to the secondary battery; and estimate an electrical characteristic value of the secondary battery based on the first electrical characteristic value and the second electrical characteristic value, wherein the first electrical characteristic value is an impedance of a reaction resistor, the second electrical characteristic value is an impedance of a serial resistance and a diffusion resistance, and control charging or discharging of the secondary battery through the current output device based on the electrical characteristic value so as to reduce energy loss caused by the reaction resistor, the serial resistance, and the diffusion resistance, thereby maximizing an energy efficiency of the second battery.

* * * * *